United States Patent
Francis et al.

(10) Patent No.: US 6,753,580 B1
(45) Date of Patent: Jun. 22, 2004

(54) DIODE WITH WEAK ANODE

(75) Inventors: Richard Francis, Manhattan Beach, CA (US); Chiu Ng, El Segundo, CA (US); Fabrizio Ruo Redda, Caselle (IT)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/565,148

(22) Filed: May 5, 2000

(51) Int. Cl.[7] .............................................. H01L 29/76
(52) U.S. Cl. ....................... 257/367; 257/88; 257/40; 257/471; 257/474
(58) Field of Search ................................ 257/367, 373, 257/611, 605, 608, 40, 88, 471, 474

(56) References Cited

U.S. PATENT DOCUMENTS

| | | | | |
|---|---|---|---|---|
| 3,667,009 A | * | 5/1972 | Rugg | 148/DIG. 122 |
| 4,997,788 A | * | 3/1991 | Martens | 437/175 |
| 5,214,276 A | * | 5/1993 | Himoto et al. | 250/214.1 |
| 5,362,975 A | * | 11/1994 | von Windheim et al. | 204/410 |
| 5,859,465 A | * | 1/1999 | Spring | 257/484 |
| 6,175,143 B1 | * | 1/2001 | Fujihira | 257/471 |
| 6,229,180 B1 | * | 5/2001 | Yoshida | 257/355 |
| 6,373,076 B1 | * | 4/2002 | Alok et al. | 257/109 |

FOREIGN PATENT DOCUMENTS

JP 402187071 A * 7/1990

* cited by examiner

*Primary Examiner*—Wael Fahmy
*Assistant Examiner*—Nathan W. Ha
(74) *Attorney, Agent, or Firm*—Ostrolenk, Faber, Gerb & Soffen, LLP

(57) ABSTRACT

A diode is formed having a weak injection shallow, low P concentration anode in an N type wafer or die. The resulting diode has a soft reverse recovery characteristic with low recovery voltage and is particularly useful either as a power factor correction diode or as an antiparallel connected diode in a motor control circuit.

8 Claims, 2 Drawing Sheets

DIODE WITH WEAK ANODE

RELATED APPLICATIONS

This application relates to application IR-1462 (IGBT WITH AMORPHOUS SILICON TRANSPARENT COLLECTOR—Richard Francis), U.S. Ser. No. 09/56629, filed May 5, 2000 IR-1706 (ANNEAL-FREE PROCESS FOR FORMING WEAK COLLECTOR—Richard Francis and Chiu Ng), U.S. Ser. No. 09/565928, filed May 5, 2000; IR-1707 (PROCESS FOR FORMING SPACED ACTIVATED WA COLLECTORS ON THIN IGBT SEMICONDUCTOR WAFERS—Richard Francis and Chiu Ng), U.S. Ser. No. 09/565973, filed May 5, 2000; and Ser. No. 09/565922, filed May 5, 2000 (HYDROGEN IMPLANT FOR BUFFER ZONE OF PUNCH-THROUGH NON EPI IGBT—Richard Francis and Chiu Ng).

FIELD OF THE INVENTION

This invention relates to a diode structure and method for its manufacture, and more specifically relates to a novel diode which has a reduced reverse recovery voltage characteristic and a soft turn-off characteristic.

BACKGROUND OF THE INVENTION

Semiconductor diodes are well known, and are commonly made by diffusing a deep P/N junction into the surface of a monocrystalline silicon substrate. For example, a wafer of silicon having an epitaxially formed N type top layer may have a deep P diffusion formed in its top surface. Such diffusions are typically 4–20 $\mu$m microns deep. Anode and cathode electrodes are then directly or indirectly connected to the P and N regions respectively. A suitable termination structure is also provided. Heavy metals such as gold and platinum may be diffused into the body of the silicon to "kill" or reduce the lifetime of minority carriers, thus increasing the turn-off speed of the device. Alternatively, E-beam radiation can be used for lifetime killing alone or with the heavy metals.

Such diodes have turn-off characteristics which can be detrimental in certain circuit applications. For example, when the diode becomes reverse biased for turnoff, the current will reverse through zero and then recover during a time to. As the current rises toward zero, it will have a recovery rate di/dt that will induce high voltage spikes in inductive circuits. U.S. Pat. No. 5,747,872 describes a soft turn-off diode, employing highly doped N and P layers separated by a lightly doped N layer and using heavy metal diffusion and irradiation.

It would be very desirable to have a diode with a "soft" turn off characteristic and reduced recovery voltage characteristics and of simple structure for use in inductive circuits such as power factor correction circuits. Such a diode would reduce the production of high voltage spikes during diode turn-off in such circuits.

BRIEF DESCRIPTION OF THE INVENTION

In accordance with the invention, a diode is made with a "weak" anode, that is, an intentionally weak injecting anode. Such an anode will produce a diode with soft turn-off characteristics.

Weak anodes, sometimes termed "transparent" anodes, are known for use with non-punch through insulated gate bipolar transistors ("NPT IGBTs") where they are used as a collector region of reduced injection efficiency. Such anodes are used to replace the need for buffer layers and lifetime killing in NPT IGBTs. These device will have a DMOS type top structure in a wafer, and the weak anode in the bottom surface of an ultra thin float zone silicon wafer.

In accordance with the invention, the conventional deep and heavily doped P diffusion into N type silicon of a conventional diode is replaced by a much shallower weak anode. The weak anode can be formed by a very shallow (0.5 micron) boron implant having a dose of about 1E14 cm$^{-2}$ at 80 KeV. It should be noted that only about 5% to 10% of the implanted dopant is electrically active because a conventional activation procedure of annealing at above about 700° C. is not used. Other doses can be used, in the range of 1E11 to 1E16, depending on the forward voltage drop and reverse recovery required.

An aluminum layer is then sputtered or evaporated atop the boron implant and is sintered at about 420° C. for 30–60 minutes. This may be followed with E-beam radiation of the wafer to further reduce the minority carrier lifetime.

Alternatively, the weak anode can be formed by the deposition of P type amorphous silicon on the wafer surface, as disclosed in copending U.S. application Ser. No. 09/566219, filed May 5, 2000 (IR-1462). The silicon surface receiving the weak anode may also be heated in vacuum as disclosed in copending application Ser. No. 09/565928 (IR-1706) to eliminate the need for the anneal step to activate the weak anode junction. The spaced activated weak anode described in copending U.S. application Ser. No. 09/565922 (IR-1708) may also be used.

The resulting diode formed by any of these processes will have a soft turn-off characteristic and reduced recovery charge. These characteristics make it ideal for use in motor control circuits, and as a power factor correction diode.

DETAILED DESCRIPTION OF THE DRAWINGS

Figure 1:
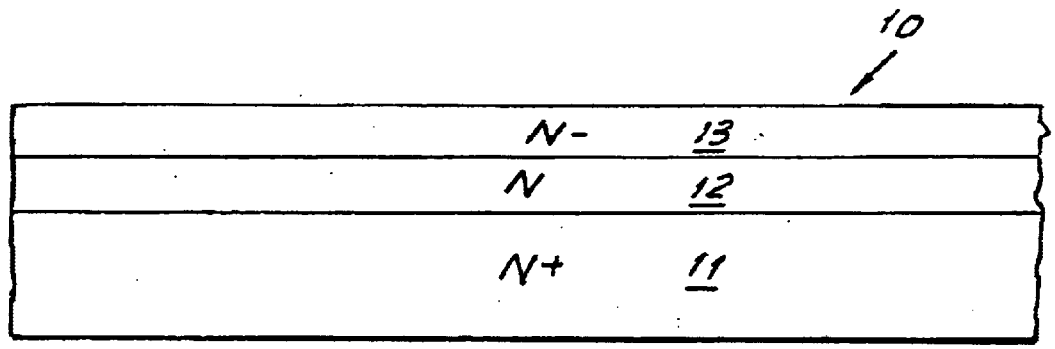
FIG. 1 is a cross-section of a portion of a starting wafer which can be used with the novel invention.

Referring first to FIG. 1, there is shown a small portion of a starting wafer 10, in section. Wafer 10 may have a diameter of 125 millimeters and a thickness of 400 microns. A large number of identical die are to be formed in wafer 10, and are simultaneously processed and then separated when the processing is complete.

The wafer of FIG. 1 has a main N$^{30}$ body portion 11 which has epitaxially formed N type layer 12 and N$^{31}$ layer 13 thereon. Layer 12 may be eliminated if desired, and layer 13 can be formed directly on layer 11.

Alternatively, the wafer 10 could be an N$^-$ float zone (FZ) wafer in which an N$^{30}$ dopant is diffused into the backside of wafer 10 to a depth of about 250 microns to form N$^{30}$ region 11, and leaving the N$^{31}$ region 13 to an appropriate thickness.

In a particular embodiment of the invention for forming a diode with a blocking voltage of 600 volts, layers 11, 12 and 13 may have thicknesses of 375, 25, and 35 microns respectively, and resistivities of .005, 10 and 45 ohm cm respectively. In the FZ embodiment, the $N^{30}$ diffused portion would have a surface zone N of greater that $1\times10^{20}$ atoms/cc and a depth of 200 to 270$\mu$m, and the region 13 would be 25 ohm cm.

Each die in wafer 10 may typically have dimensions of 150 mils by 150 mils so that 690 die can be formed in wafer 10. These die are separated by sawing in the "streets" (not shown) left between die in the usual manner.

Figure 2:
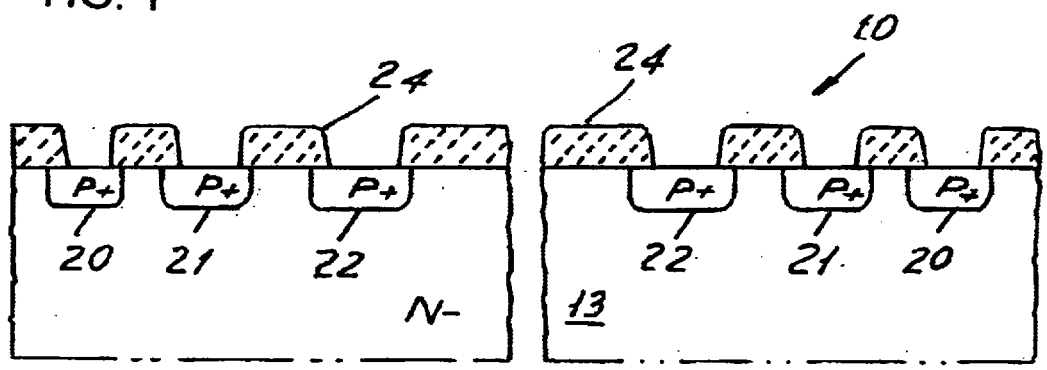
FIG. 2 shows the top of the wafer of FIG. 1 after the formation of termination diffusions therein for a single one of the die to be formed in the wafer of FIG. 1.

FIG. 2 shows the central area of one such die after a first series of conventional steps used to form the die termination in region 13. Thus, using standard photolithographic processing steps, $P^+$ termination rings 20, 21 and 22 are diffused into the top surface 23 of layer 13 to a depth, for example, of 5 microns and a width, for example, of 14 microns for rings 20 and 21 and 16 microns for ring 22. A conventional field oxide 24 having concentric ring-shaped openings defines the diffusions 20 to 22 as shown in FIG. 2.

The same steps used in FIG. 2 would be used in the conventional fabrication process of known diodes.

Figure 3:
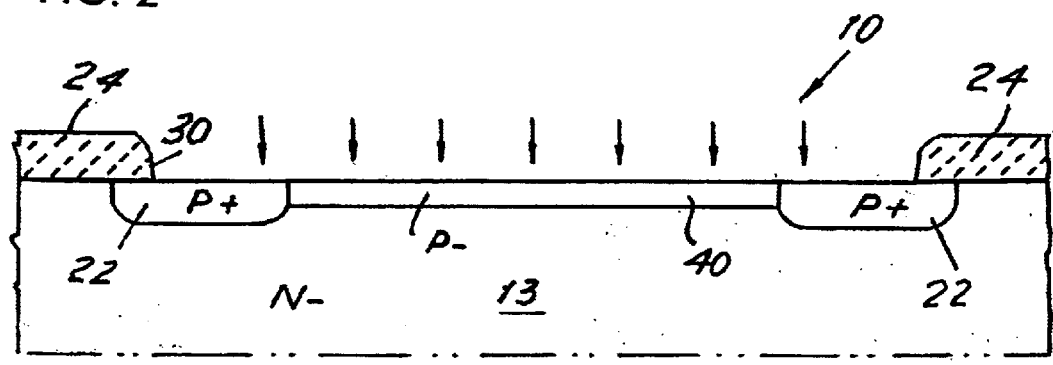
FIG. 3 shows the implant of a shallow weak anode into the top surface of the wafer of FIG. 2.

The field oxide interiorly of the area enclosed by ring 22 is then removed as shown in FIG. 3 to prepare the die surface for the formation of the diode P/N junction in the exposed $N^-$ layer 13. However, in accordance with the invention, instead of forming the usual high concentration P type diffusion into - region 13, a weak anode is formed.

Thus, as shown in FIG. 3, and in accordance with the invention, the $N^-$ surface of layer 13 exposed by the window 30 in oxide layer 24 is exposed to a boron implant at a dose of about 1E14 $cm^{-2}$ at about 80KeV. This forms a relatively lightly doped, shallow $P^-$region 40 which is about 0.5 micron deep. The depth of the weak anode can be between about 0.1 microns to about 0.6 microns and can have an implant boron dose of from 1E11 to 1E16 per $cm^2$ at an implant energy of 20–100KeV.

The wafer can then be placed in a sputter tool and preheated to about 400° C. for 30 to 60 seconds in vacuum to remove moisture and contaminants from the silicon surface, as described in copending application U.S. Ser. No. 09/565973 (IR-1707).

Figure 4:
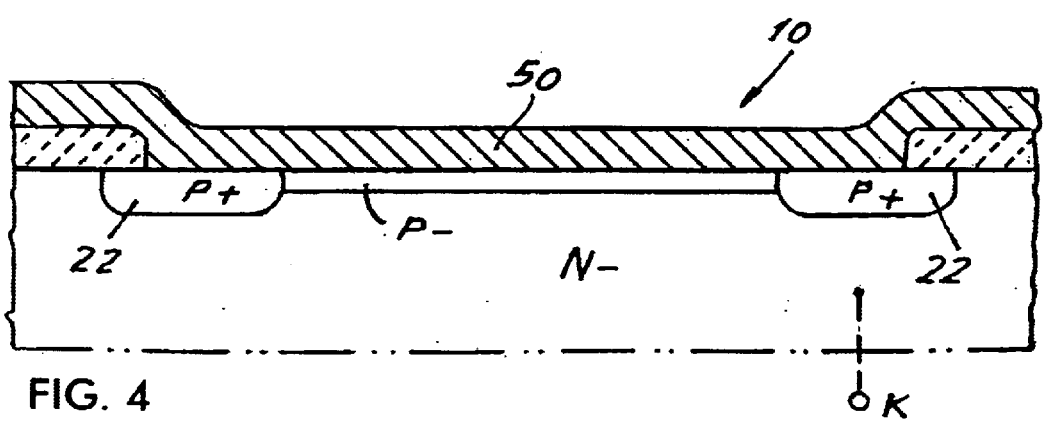
FIG. 4 shows the formation of an aluminum anode electrode on the implanted anode of FIG. 3.

Thereafter, and as shown in FIG. 4, an aluminum layer 50 is sputtered atop region 40 to a thickness of about 1 to 4 microns; (alternatively, an aluminum layer is sputtered or evaporated atop legion 40 and) is sintered at about 400° C. for 30–60 minutes. The aluminum layer 50 may then be used as a wire bondable anode contact electrode. However, if a solderable front metal desired, aluminum layer may be about 1000Å thick and then covered by sputtered or evaporated layers 51, 52 and 53 of titanium (1000Å); nickel vanadium (4000Å) and silver (6000Å) respectively, as shown in FIG. 5.

Figure 5:
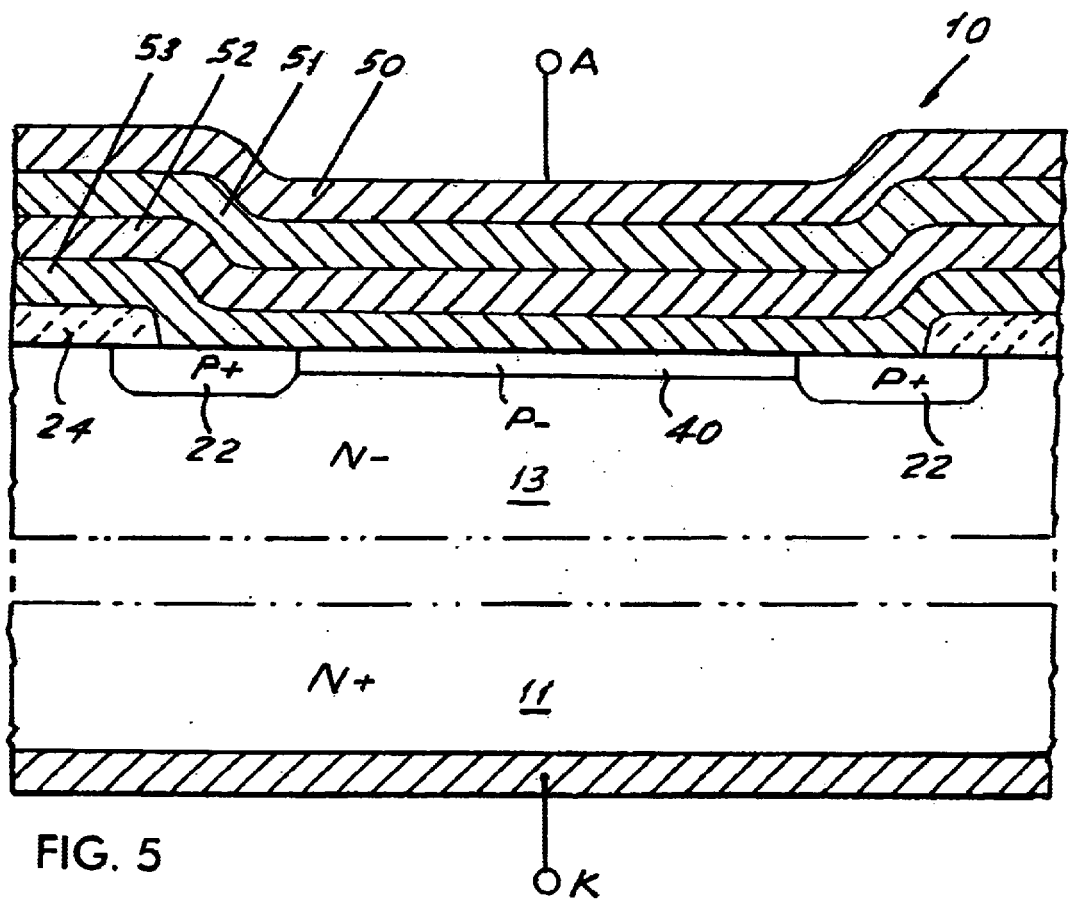
FIG. 5 is a cross-section of the wafer of FIG. 1, showing the anode and cathode contacts.

FIG. 5 also shows a conventional cathode electrode 60 on the bottom surface of region 11 to complete the diode. Note that conventional B-beam treatment can be used to reduce lifetime in the silicon 10 to increase device speed. However, the soft-turn of characteristic provided by weak anode 40 will be retained.

It should be further noted that the weak anode 40 can also be formed by depositing P type amorphous silicon on the surface of region 13, followed by the steps of FIGS. 4 and 5.

Figure 6:
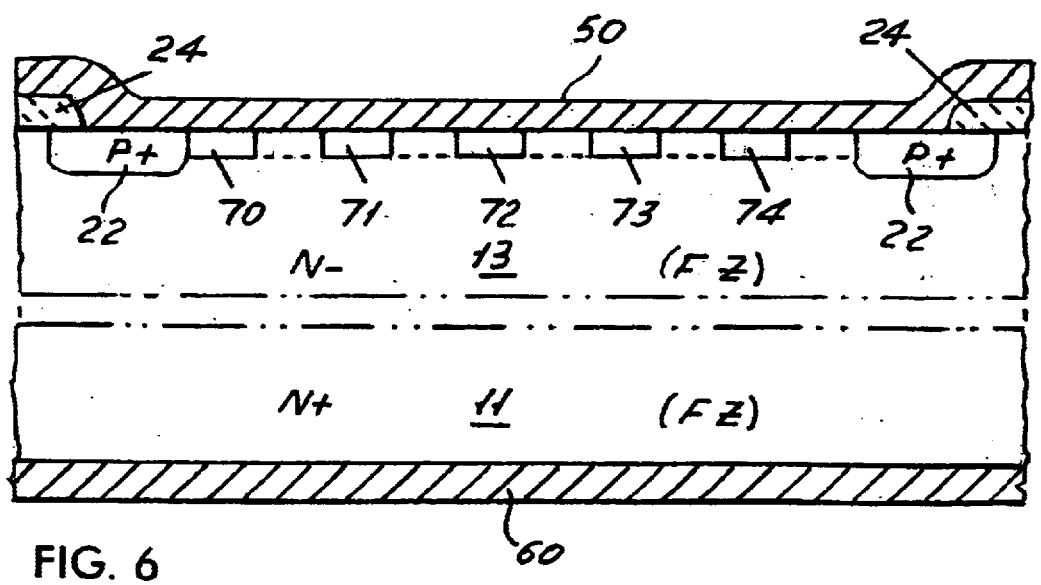
FIG. 6 is a cross-section of the wafer of FIG. 1, showing the weak anode formed of a plurality of spaced segments.

As stated previously, the weak anode can be formed of spaced implants in the manner described in copending application Ser. No. 09/565922 (IR-1708). This structure is shown in FIG. 6, for the $N^-$ region 13 of a float zone (FZ) wafer 10. Thus, the $P^-$ weak anode 40 of FIGS. 4 and 5 is made of separated small area segments 70, 71, 72, 73 and 74 in FIG. 6. This enables the use of a higher dose implant into region 13, for example greater than $5\times10^{11}$ atoms/$cm^2$ which can be well controlled, while forming the effect of a much lower implant dose of about $1\times10^{10}$ to $5\times10^{11}$ which is very hard to control with presently existing commercial implanters.

The separated regions can be separated as by implanting through a nickel mesh mask, or by laser beam activation of only the separated areas 70 to 74 of a continuous shallow implant. Regions 70 to 74 may have typical areas of about 50 microns × 50 microns in rows spaced from one another by about 50 to 200 microns with depths of about 0.1 to 0.6 microns.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A diode having soft off characteristics, comprising a die of one conductivity type having a weak anode formed in one surface thereof to form the only rectifying junction in said die; said weak anode consisting of a shallow, weak injection region formed by an amorphous silicon layer of another conductivity type deposited atop said die; and a cathode formed on the bottom of said die opposite said one surface.

2. The diode of claim 1, wherein said weak anode has a depth of from about 0.1 to about 0.6 micron and a concentration defined by an implant dose of about $1\times10^{11}$ to $1\times10^{14}$ $cm^{-2}$ at 20 to 100 KcV of a dopant of said other conductivity type.

3. The diode of claim 1, wherein said weak anode has an aluminum anode contact layer deposited thereon.

4. The diode of claim 2, wherein said weak anode has an aluminum anode contact layer deposited thereon.

5. The diode of claim 1, wherein said weak injection region is formed of a plurality of laterally spaced regions.

6. The diode of claim 2, wherein said weak injection region is formed of a plurality of laterally spaced regions.

7. The diode of claim 6, wherein said weak anode has an aluminum anode contact layer deposited therein.

8. The diode of claim 7, wherein said weak anode has an aluminum anode contact layer deposited therein.

* * * * *